US005600173A

United States Patent [19]
Suzunaga

[11] Patent Number: 5,600,173
[45] Date of Patent: Feb. 4, 1997

[54] SEMICONDUCTOR DEVICE CAPABLE OF DETECTING A LIGHT POSITION

[75] Inventor: Hiroshi Suzunaga, Tokyo, Japan

[73] Assignee: Kabushiki Kaisha Toshiba, Kanagawa-ken, Japan

[21] Appl. No.: 385,203

[22] Filed: Feb. 8, 1995

Related U.S. Application Data

[63] Continuation of Ser. No. 66,280, May 26, 1993, abandoned.

[30] Foreign Application Priority Data

May 28, 1992 [JP] Japan .................................. 4-137064

[51] Int. Cl.$^6$ .................................................. H01L 31/00
[52] U.S. Cl. ........................ 257/446; 257/448; 257/459; 257/461; 257/463; 257/465
[58] Field of Search .................................. 257/446, 448, 257/457, 461, 463, 464, 465

[56] References Cited

U.S. PATENT DOCUMENTS

| | | | |
|---|---|---|---|
| 4,241,958 | 12/1980 | Wade | 257/461 |
| 5,252,851 | 10/1993 | Mita et al. | 257/446 |

FOREIGN PATENT DOCUMENTS

| | | | |
|---|---|---|---|
| 61-955580 | 5/1986 | Japan | 257/446 |
| 62-232959 | 10/1987 | Japan | 257/446 |
| 1-205564 | 8/1989 | Japan | 257/446 |
| 1-276777 | 11/1989 | Japan | 257/454 |
| 1-276778 | 11/1989 | Japan | 257/459 |
| 2-224281 | 6/1990 | Japan . | |
| 2-246168 | 10/1990 | Japan | 257/461 |

*Primary Examiner*—Ngân V. Ngô
*Attorney, Agent, or Firm*—Finnegan, Henderson, Farabow, Garrett & Dunner, L.L.P.

[57] ABSTRACT

A semiconductor position sensitive detector has an epitaxial layer of a second conductivity type formed on a semiconductor substrate of a first conductivity type. A first diffusion layer of the first conductivity type is formed in said epitaxial layer so as to isolate a rectangular portion of this epitaxial layer from the rest. A second diffusion layer of the first conductivity type is further formed in said rectangular portion of the epitaxial layer, in order to increase the resistance value of the epitaxial layer. In addition, due to the formation of the second diffusion layer, two p-n junctions having photoelectric transfer ability are formed in this device. So, a semiconductor position sensitive detector having excellent photoelectric characteristics can be obtained.

20 Claims, 4 Drawing Sheets

SEMICONDUCTOR DEVICE CAPABLE OF DETECTING A LIGHT POSITION

This application is a continuation of application Ser. No. 08/066,280, filed May 26, 1993, now abandoned.

BACKGROUND OF THE INVENTION

1. Field of the invention

This invention relates to a semiconductor position sensitive detector. In particular, this invention relates to a semiconductor position sensitive detector which is made to have the same characteristic of photoelectric sensitivity for infrared light as that of a usual photo-diode, and can easily be incorporated into an integrated circuit device, especially, in a bipolar integrated circuit device.

2. Description of the prior art

Japanese unexamined publication No. Hei 2-224281 shows the first prior art of this invention. In actuality, FIG. 3a is a sectional view showing the structure of this prior art semiconductor device, and FIG. 3b is the plane view of this device. As shown in FIG. 3a, this device is comprised of an n–type semiconductor substrate 110 and a p–type resistance layer 111 formed on substrate 110. This layer 111, that is, a light receiving surface, is designed to form strips on the surface of substrate 110, as shown in FIG. 3b.

The output of this device is obtained in the form of a current. Therefore, in order to improve the S/N ratio of this device for heat noise, the resistance value of this layer ill should be as high as possible. In usual, a layer having a resistance value of several hundreds KΩ is utilized as layer 111. To accomplish this resistance value without forming stripes on the substrate surface, the impurity concentration of layer 111 should be controlled extremely low, for example, about $10^{14} cm^{-3}$. On the other hand, as is the case of said prior art, by forming stripes on the substrate surface, this resistance value can be accomplished with the impurity concentration of $10^{15} cm^{-3}$.

In the device shown in FIGS. 3a and 3b, the incident position of a light is expressed by the following equation as shown in FIG. 3c, which shows the equivalent circuit of this device:

$$x' = l' \times I1'/(I1' + I2'),$$

where l' means the length of layer 111, I1' and I2' mean the photoelectric currents detected through anode electrodes 112 and 113, respectively.

Although the device described in said publication No. 2-224281 has a PIN structure, the device shown in FIGS. 3a and 3b has a PN structure. For the purpose of finding a right position, there is no difference between the two structures. In addition, a cathode electrode 114 is provided on the top surface of this device, instead of the bottom surface.

According to said structure, the device shown in FIGS. 3a and 3b has a photoelectric sensitivity as shown in FIG. 3d. As is evident from this figure, the photoelectric sensitivity of this device does not have a constant value of the photoelectric current within the light receiving region. This is because the light receiving surface is configured to be stripes. In other words, the photoelectric sensitivity of this device varies depending on positions, like waves. As a result, the total photoelectric sensitivity of this device decreases by 20 to 40% compared with that of a simple photo diode made of the same materials.

FIGS. 4a and 4b show the structure of a second prior art of this invention. In actuality, the device of this example is structured by incorporating the device of the first prior art into a bipolar integrated circuit device. Therefore, the basic structure of this device is almost the same as that of the first prior art device, except that an n–type layer 120 is epitaxially grown on p–type substrate 126. Resistance layer 121, anode electrodes 122 and 123, and cathode electrode 124 have the same structures as those in the device shown in FIGS. 3a and 3b respectively.

Besides the disadvantages mentioned in the first prior art device, the second prior art device has the following disadvantage. That is, n–type layer 120 only has a thickness 3 to 10 µm. Accordingly, in the case of infra-red light, for example, the light having 850 nm wavelength, this layer 120 having 10 µm thickness can only absorb 40% (from an actual measurement) of the incident light. The rest of the incident light reaches p–type substrate 126, thus further lowering the photoelectric sensitivity.

As explained above, the prior art semiconductor devices have the following disadvantages.

(1) In order to improve the S/N ratio for heat noise, the light receiving surface of the prior art devices are configured to be a stripe shape. Therefore, the photoelectric sensitivity of the light receiving surface of these devices becomes a wave like form. The total photo-electric sensitivity decreases by 20 to 40% compared with that of a simple photo-diode made of the same materials.

(2) In the case where said devices are incorporated into a bipolar integrated circuit, only 40% of an incident light can be absorbed by the n–type layer. This is because the n–type layer is grown very thin on the substrate. The rest of the incident light passes the n–type layer and reaches the p–type substrate, thus further lowering the photoelectric sensitivity of these devices.

SUMMARY OF THE INVENTION

This invention has been made to overcome the above mentioned problems of the prior art devices.

Therefore, one objective of the present invention is to provide a semiconductor position sensitive detector which has the same photoelectric sensitivity as that of a conventional photo-diode in infra-red region.

Another objective of the present invention is to provide a semiconductor position sensitive detector which can easily be incorporated into a bipolar integrated circuit device.

The first feature of the present invention provides a semiconductor position sensitive detector which is comprised of the following as shown in FIG. 1: a semiconductor substrate 10 having a first conductivity type; a semiconductor epitaxial layer 11 having a second conductivity type and formed on said substrate 10; a diffusion layer 13 having the first conductivity type and formed into said epitaxial layer 11 so as to surround a portion of layer 11, said layer 13 having a depth so that layer 13 reaches said substrate 10; a pair of electrodes 17 and 18 formed on the surface of said layer 11 and arranged to be parallel for each other; and an electrode 16 formed on the surface of said diffusion layer 13.

The second feature of the present invention provides a semiconductor position sensitive detector which is comprised of the following: a semiconductor substrate 10 having a first conductivity type; a semiconductor epitaxial layer 11 having a second conductivity type and formed on said substrate 10; a diffusion layer 13 having the first conductivity type and formed into said epitaxial layer 11 so as to surround a portion of layer 11, said layer 13 having a depth so that layer 13 reaches said substrate 10; a pair of electrodes 17 and 18 formed on the surface of said layer 11 and arranged to be parallel for each other; an electrode 16 formed on the surface of said diffusion layer 13; and a semiconductor layer 19 having the first conductivity type and formed into said epitaxial layer 11, said layer 19 having a thickness smaller than that of layer 11 and being electrically connected with said diffusion layer 13.

The third feature of the present invention is in the fact that, in the semiconductor position detector having said second feature, said layer 19 is formed to overlap a portion of diffusion layer 13 so as to electrically contact with diffusion layer 13, or layer 19 is electrically connected with diffusion layer 13 through electrode 16.

According to said first feature, said epitaxial layer 11 having the second conductivity type is formed on substrate 10 having the first conductivity type so as to have a rectangular surface shape. This layer 11 is utilized to be a resistance layer. Diffusion layer 13 having the first conductivity type is formed into layer 11 so as to surround a portion of said layer 11. This layer 13 is also formed to have a depth so that it reaches substrate 10, thus electrically isolating said portion of layer 11 from the rest. In order to detect the position of an incident light, a photoelectric current activated by said incident light is detected through a pair of electrodes 17 and 18.

Because said layer 11 is formed by an epitaxial method, it has a lower impurity concentration than that of a resistance layer formed by a diffusion method. As a result, a layer having a high resistance value is easily realized without forming stripes. So, this invention can easily provide a semiconductor position sensitive detector having a high photoelectric sensitivity.

According to said second and third features, layer 19 having the second conductivity type is formed into layer 11 from its surface so as to have smaller depth than that of layer 11. Therefore, the resistance value of layer 11 becomes higher than that of the original layer 11. In addition, two photo sensitive junctions are formed in this device, so that light excited carriers arising in the substrate having the first conductivity type are utilized to detect a light position. This fact improves the photoelectric sensitivity of this device. So, the device of this invention can easily be incorporated into a bipolar integrated circuit without loosing the high photoelectric sensitivity.

These and other objectives, features, and advantages of the present invention will be more apparent from the following detailed description of preferred embodiments in conjunction with the accompanying drawings.

BRIEF DESCRIPTION OF THE DRAWINGS

FIG. 1b is a plane view showing the structure of the position sensitive detector shown in FIG. 1a;

FIG. 3b is a plane view showing the structure of the position sensitive detector shown in FIG. 3a;

FIG. 4b is a plane view showing the structure of the position sensitive detector shown in FIG. 4a.

DETAILED DESCRIPTION OF PREFERRED EMBODIMENTS

Figure 1A:
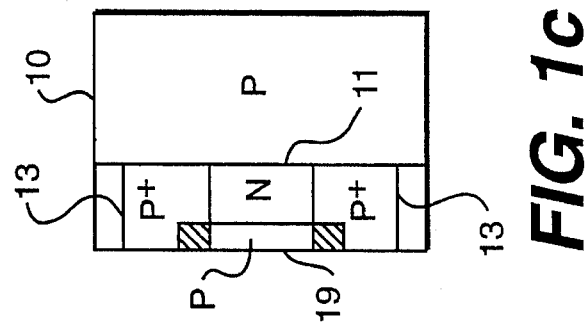
FIG. 1a is a cross sectional view in x-direction showing the structure of a position sensitive detector according to one embodiment of the present invention.
Figure 1B:
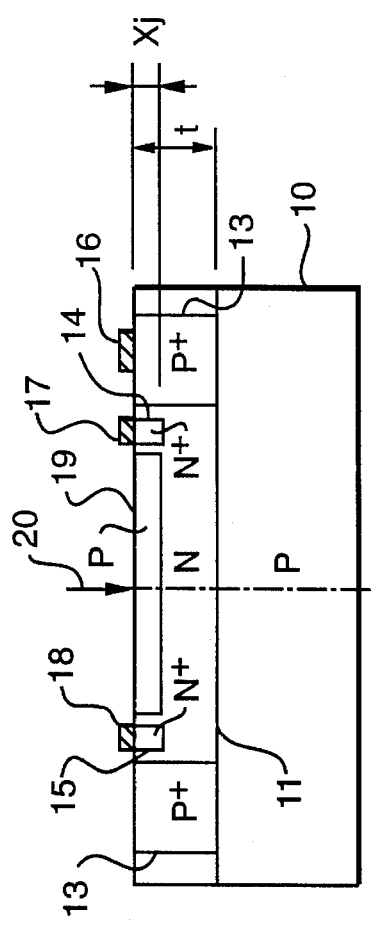
Figure 1C:
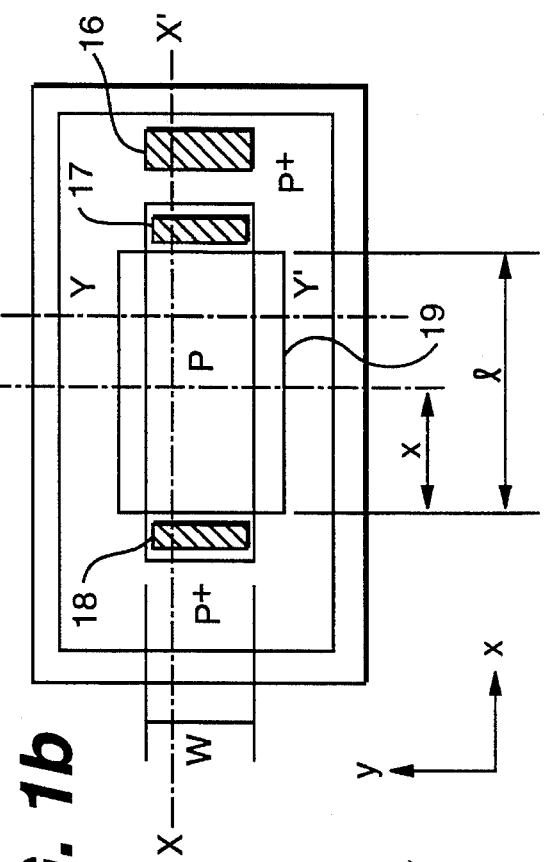
FIG. 1c is a cross sectional view in y-direction showing the structure of the position sensitive detector shown in FIGS. 1a and 1b.

FIGS. 1a, 1b, and 1c show the structure of a position sensitive detector according to one embodiment of this invention. FIG. 1a is a cross sectional view in X—X' direction, FIG. 1b is a plane view, and FIG. 1c is a cross sectional view in Y—Y' direction of this device.

As shown in these figures, the position sensitive detector of this embodiment is comprised of the following: a p–type Si substrate 10; an n–type epitaxial layer 11 grown on p–type Si substrate 10; a p+type diffusion layer 13 which is formed in layer 11 so as to surround a rectangular portion of said layer 11; a pair of signal electrodes (anode electrodes) 17 and 18 formed on the surface of n–type layer 11; another electrode (cathode electrode) 16 formed on the surface of p+type layer 13; and a p–type diffusion layer 19 formed in layer 11. Said diffusion layer 13 is formed into layer 11 so as to reach the surface of substrate 10, thus electrically isolating said rectangular portion of layer 11 from the rest. Said electrodes 17 and 18 are arranged to be parallel to each other on the surface of layer 11. Further, said layer 19 has a depth smaller than that of layer 11.

Said n–type epitaxial layer 11 is used as a resistance layer, and p+type diffusion layer 13 electrically isolates the rectangular portion of layer 11 from the rest.

The position sensitive detector of this embodiment is fabricated in the same manner as that of a usual bipolar integrated circuit device. For instance, using an epitaxial method, n–type epitaxial layer 11 is grown on p–type Si substrate 10 in a rectangular form. Then, by diffusing p–type impurities into layer 11, p+type isolation layer 13 is formed so as to surround a predetermined area of layer 11. This layer 13 should reach the surface of substrate 10. Also, said predetermined area of layer 11 should be designed to be a light receiving area. Thereafter, p–type diffusion layer 19 is formed in n–type epitaxial layer 11. In this case, portions of p–type diffusion layer 19 should overlap on portions of p+type isolation layer 13, as shown in FIG. 1c (the shadowed portions). N+type diffusion layers 14 and 15 are, then, formed in layer 11 in order to make contacts between layer 11 and electrodes. Anode electrodes 17 and 18, and cathode electrode 16 are formed using Al as an electrode material.

In the device described above, the magnitude of resistance R of n–type epitaxial layer 11 can be calculated as follows. Let the length 1 of n–type epitaxial layer (resistance layer) 11 be 2 mm, its width w be 0.5 mm, its thickness be 5 μm, its resistivity be 10 μm, and the depth Xj of p–type diffusion layer 19 be 3 μm. Then, the value R is calculated as follows.

$$R = 10 \times 2 \times 10^{-1} / 0.5 \times 10^{-1} \times (5-3) \times 10^{-4} = 200 \ K\Omega$$

As is evident from the value R, that is, 200 KΩ, the resistance layer 11 of this embodiment can realize a high resistance value, that is, more than 100 KΩ, without forming the light receiving plane to be a stripe shape.

Figure 2A:
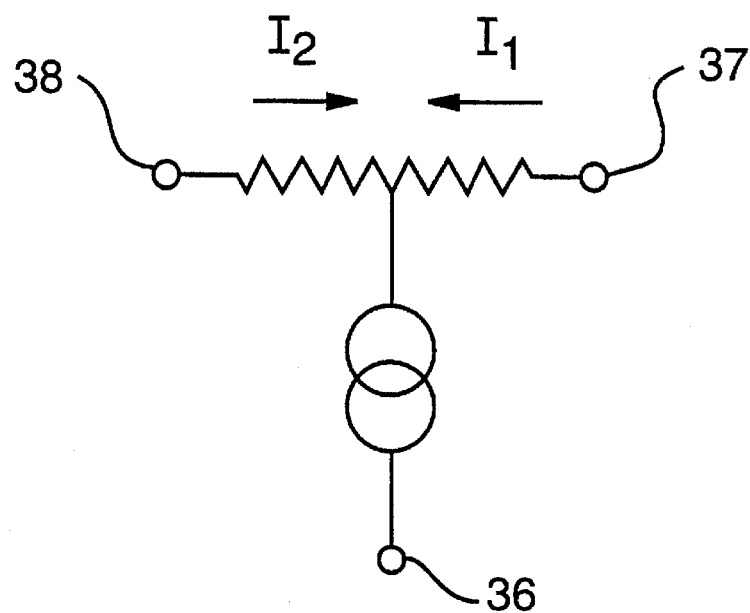
FIG. 2a is a view showing the equivalent circuit of the position sensitive detector shown in FIGS. 1a, 1b, and 1c.
Figure 2B:
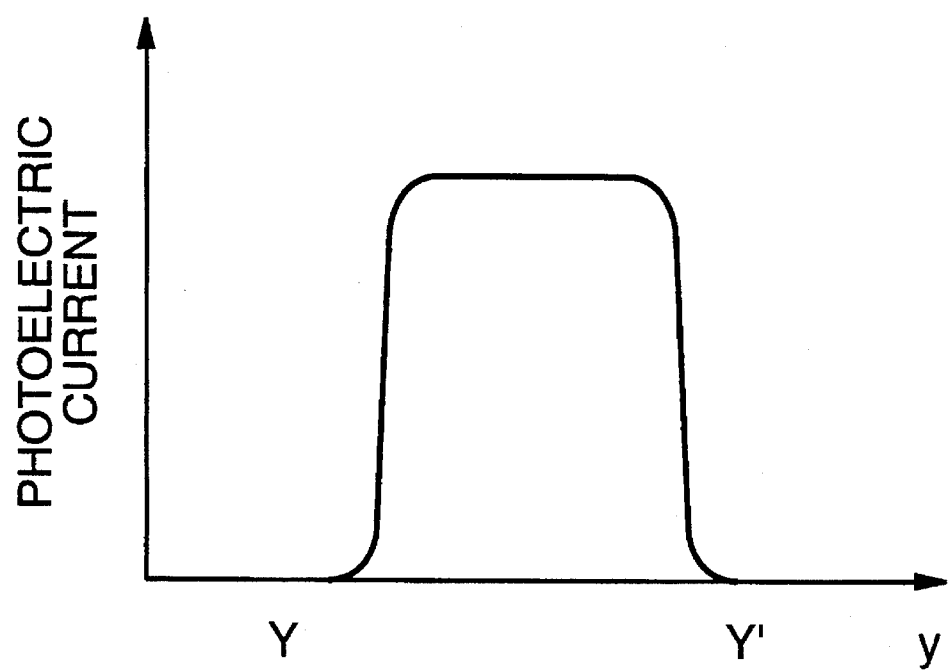
FIG. 2b is a view showing the characteristic of photoelectric sensitivity of the position sensitive detector shown in FIGS. 1a, 1b, and 1c.
Figure 3A:
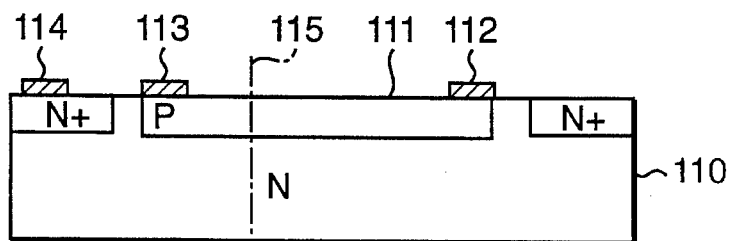
FIG. 3a is a cross sectional view showing the structure of a position sensitive detector according to one prior art of this invention.
Figure 3B:
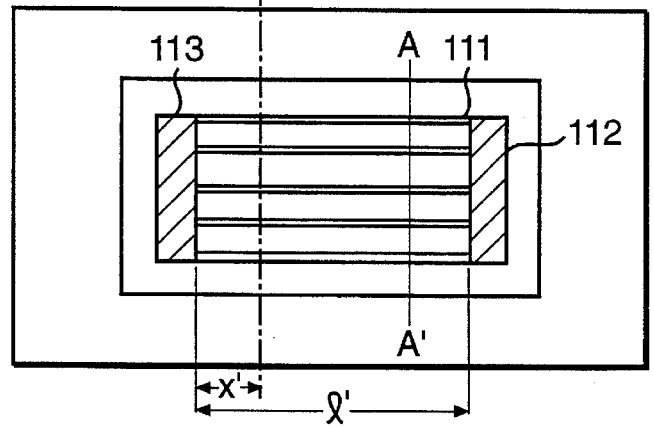
Figure 3C:
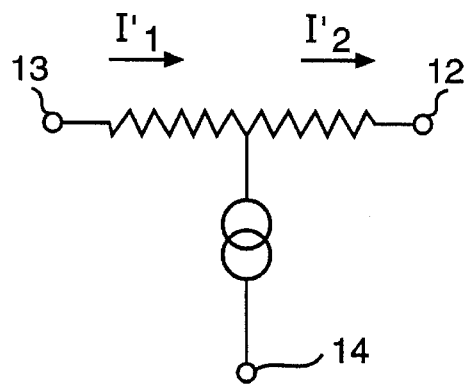
FIG. 3c is a view showing the equivalent circuit of the position sensitive detector shown in FIGS. 3a and 3b.
Figure 3D:
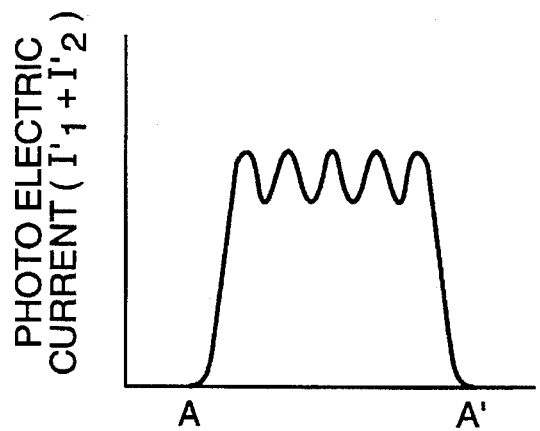
FIG. 3d is a view showing the characteristic of photoelectric sensitivity of the position sensitive detector shown in FIGS. 3a and 3b.
Figure 4A:
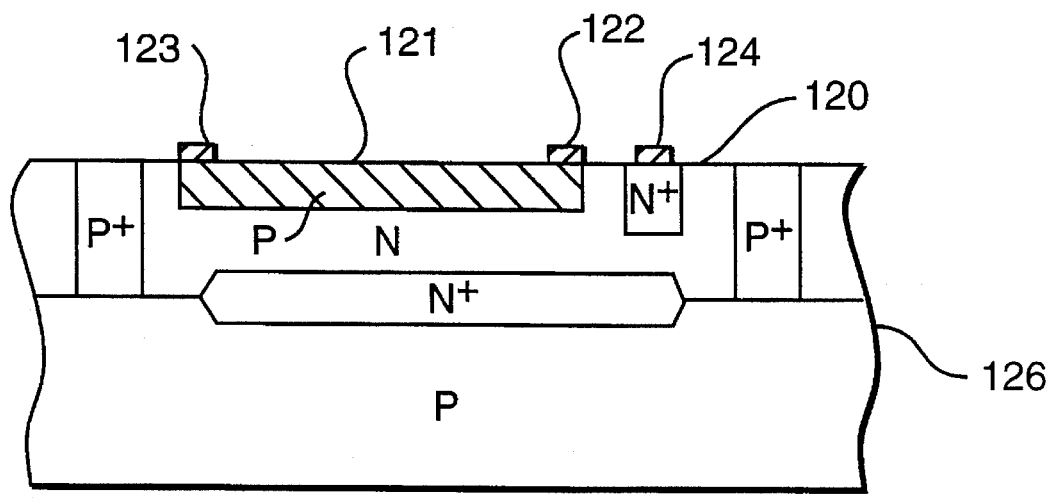
FIG. 4a is a cross sectional view showing the structure of a position sensitive detector according to another prior art of this invention.
Figure 4B:
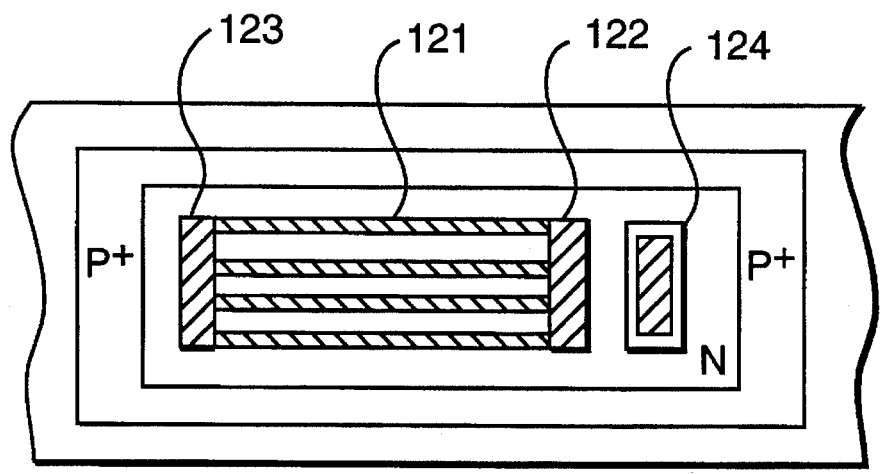

In this embodiment, in the same manner as that of the prior art shown in the equivalent circuit of FIG. 2a, the position of an incident light can be expressed as follows using photoelectric currents I1 and I2.

$$x=|X|I1/(I1+I2)$$

The position sensitive detector of this embodiment has no stripe-like light receiving plane, therefore, the photoelectric sensitivity of this device becomes flat within the photo receiving region. In addition, this device has two junctions, each of which has a photoelectric transfer ability, at depths of 3 μm and 5 μm. Accordingly, this device can have the same characteristic of photoelectric sensitivity as that of a usual photo-diode for a light from visible to infra-red region (~950 nm). And even more, the sensitivity can be improved by 20–60% as compared with that of the prior art device.

In addition, with other elements such as bipolar transistors, resistors, and FETs, the position sensitive detector of this embodiment can easily be incorporated into an integrated circuit device.

In this embodiment, portions of p–type diffusion layer 19 and p+type isolation layer 13 overlap for each other so as to electrically connect layer 19 with layer 13. However, this connection can be realized using other methods. For example, an Al electrode may be formed on p–type diffusion layer 19, and then, this electrode may be connected with cathode electrode 16.

In order to increase the resistance value of n–type epitaxial layer 11, this embodiment provides a p–type diffusion layer 19 in layer 11, thus realizing a position sensitive detector having a large resistance value and high photoelectric sensitivity. However, this layer 19 should not always be required to accomplish this invention. Without providing layer 19, the position sensitive detector of this invention can have a high photoelectric sensitivity for infra-red light.

Further, the conductivity types of this embodiment can be changed from p to n type, or n to p type, without loosing the advantages of this invention.

In said embodiment, a p–type Si substrate is used as a semiconductor substrate. However, this invention may utilize Ge and GaAs substrates or the like to be a semiconductor substrate.

In summary, according to the present invention, an epitaxial layer which has a second conductivity type and a rectangular surface form is grown, in order to utilize as a large resistance layer, on a semiconductor substrate having a first conductivity type. In addition to this layer, a diffusion layer, which has a depth to reach the surface of the substrate and have the first conductivity type, is provided so as to surround and isolate a portion of said epitaxial layer having the second conductivity type. In this device, in order to find a position, a photoelectric current activated by an incident light is detected as a signal current through a pair of electrodes formed on the surface of the epitaxial layer, the electrodes which are arranged to be parallel to each other. So, this invention can easily realize a semiconductor layer having a lower impurity concentration than that of a resistance layer formed by a diffusion method. By applying this epitaxial layer, a large resistance value can be obtained without forming stripes. Consequently, this invention provides a position sensitive detector which has a high photoelectric sensitivity and can easily be incorporated into a bipolar integrated circuit device.

Further in this invention, a second semiconductor layer, which has the first conductivity type and is formed thinner than that of the epitaxial layer, may be formed in this epitaxial layer having the second conductivity type. Because of the existence of this second layer having the first conductivity type, the resistance value of the epitaxial layer increases. In addition, two junctions having a photoelectric transfer ability are formed in this case. Therefore, light activated carriers arising in the semiconductor substrate having the first conductivity type can be used to find a position. So, this invention can provide a position sensitive detector which has a higher photoelectric sensitivity than that of a usual photo-diode and can easily be integrated into a bipolar integrated circuit device.

What is claimed is:

1. A semiconductor device for detecting a light position radiated thereon comprising:

a semiconductor substrate of a first conductivity type;

a semiconductor epitaxial layer of a second conductivity type, the epitaxial layer being formed on said substrate;

a diffusion layer of said first conductivity type, the diffusion layer being formed into said epitaxial layer so as to surround a portion of said epitaxial layer, said diffusion layer having a depth extending to said substrate;

a light receptive single layer formed by diffusion into said portion of said epitaxial layer and having said first conductivity type, said light receptive single layer extending across said epitaxial layer so as to contact said diffusion layer;

a pair of electrodes formed on the surface of said epitaxial layer, said electrodes being parallel to each other; and a second electrode formed on the surface of said diffusion layer.

2. A semiconductor device for detecting a light position comprising:

a semiconductor substrate of a first conductivity type;

a semiconductor epitaxial layer of a second conductivity type, the epitaxial layer being formed on said substrate;

a first diffusion layer of said first conductivity type, the first diffusion layer being formed into said epitaxial layer so as to surround a portion of said epitaxial layer, said first diffusion layer having a depth extending to said substrate;

a pair of electrodes formed on the surface of said epitaxial layer, said electrodes being parallel to each other;

a second electrode formed on the surface of said first diffusion layer; and a light receptive single layer of said first conductivity type, the light receptive single layer being formed by diffusion into said portion of said epitaxial layer having a thickness smaller than that of said epitaxial layer, and extending across said epitaxial layer so as to contact said first diffusion layer.

3. The semiconductor device as claimed in claim 1 or 2, wherein the surface of said portion of said epitaxial layer has a rectangular shape.

4. The semiconductor device as claimed in claim 1 or 2, wherein said first conductivity type is a p type, and said second conductivity type is an n type, or said first conductivity type is an n type, and said second conductivity type is a p type.

5. The semiconductor device as claimed in claim 1 or 2, wherein said semiconductor substrate is made of a semiconductor Si, Ge, or GaAs substrate.

6. The semiconductor device as claimed in claim 1 or 2, further comprising third diffusion layers of said second conductivity type, the third diffusion layers being formed in said epitaxial layer under each of said electrode pair.

7. The semiconductor device as claimed in claim 2, wherein said first diffusion layer of the first conductivity type has an impurity concentration higher than that of said substrate of the first conductivity type.

8. The semiconductor device as claimed in claim 1, wherein said diffusion layer of the first conductivity type has an impurity concentration higher than that of said substrate of the first conductivity type.

9. A semiconductor device for detecting a light position radiated thereon comprising:
   a semiconductor substrate of a first conductivity type;
   a photo sensitive semiconductor epitaxial layer of a second conductivity type, the epitaxial layer being formed on said substrate;
   a diffusion layer of said first conductivity type, the diffusion layer being formed into said epitaxial layer to surround a rectangular portion of said epitaxial layer and having a depth extending to said substrate;
   a light receptive single layer formed by diffusion into said portion of said epitaxial layer and having said first conductivity type, said light receptive single layer extending across said epitaxial layer so as to contact said diffusion layer;
   a pair of electrodes formed on the surface of said epitaxial layer, said electrodes being parallel to each other; and
   a second electrode formed on the surface of said diffusion layer.

10. A semiconductor device for detecting a light position comprising:
    a semiconductor substrate of a first conductivity type;
    a photo sensitive semiconductor epitaxial layer of a second conductivity type being formed on said substrate;
    a first diffusion layer of said first conductivity type, the first diffusion layer being formed into the epitaxial layer to surround a rectangular portion of the epitaxial layer and having a depth extending to the substrate;
    a pair of electrodes formed on an upper surface of the epitaxial layer, the electrodes being parallel to each other;
    a second electrode formed on an upper surface of said first diffusion layer; and
    a light receptive single layer of said first conductivity type, the light receptive single layer being in said portion of said epitaxial layer to increase resistance of the epitaxial layer, and said light receptive single layer extending to said first diffusion layer to form overlapped portions of said first diffusion layer and said light receptive single layer.

11. A semiconductor position sensitive detector comprising:
    a semiconductor substrate of a first conductivity type; an epitaxial layer on said semiconductor substrate and having a second conductivity type opposite to said first conductivity type;
    an isolation layer formed through said epitaxial layer by diffusion;
    a resistive layer defined and surrounding by said isolation layer within said epitaxial layer;
    a light-reception layer formed by diffusion into said epitaxial layer astride said resistive layer, having a thickness smaller than that of said resistive layer and extending across said epitaxial layer so as to contact said isolation layer;
    a pair of first electrodes on said resistive layer with said light-reception layer therebetween; and
    a second electrode on said isolation layer.

12. A semiconductor position sensitive detector for detecting a position of light incident upon said detector with respect to a first direction, said detector comprising:
    a semiconductor substrate of a first conductivity type;
    an epitaxial layer formed on said semiconductor substrate and having a second conductivity type opposite to said first conductivity type;
    an isolation layer formed through said epitaxial layer by diffusion and having said first conductivity type in order to define a resistive layer having said second conductivity type surrounded by said isolation layer within said epitaxial layer;
    a light-reception diffusion layer having said first conductivity type and formed within said epitaxial layer above said resistive layer in order that said resistive layer is formed extending beyond said light-reception layer in said first direction with a pair of surface portions between which said light-reception diffusion layer is located and that said light-reception diffusion layer is formed extending beyond said resistive layer in a second direction normal to said first direction in order to make contact with said isolation layer;
    a pair of first electrodes formed on said pair of the surface portions of said resistive layer; and
    a second electrode formed on said isolation layer making contact with said light-reception diffusion layer.

13. The semiconductor device according to claim 10, wherein the first conductivity type is p–type.

14. The semiconductor device according to claim 10, wherein the first conductivity type is n–type.

15. The semiconductor device according to claim 10, wherein the semiconductor substrate comprises a compound semiconductor.

16. The semiconductor device according to claim 10, further comprising a pair of contact regions in said portion of said epitaxial layer under said electrodes, the pair of contact regions having a higher impurity concentration than said epitaxial layer.

17. The semiconductor device according to claim 12, wherein the first conductivity type is p–type.

18. The semiconductor device according to claim 12, wherein the first conductivity type is n–type.

19. The semiconductor device according to claim 12, wherein the semiconductor substrate comprises a compound semiconductor.

20. The semiconductor device according to claim 12, further comprising a pair of contact regions in said portion of said epitaxial layer under said electrodes, the pair of contact regions having a higher impurity concentration than said epitaxial layer.

* * * * *